US009673245B2

(12) United States Patent
Kao et al.

(10) Patent No.: US 9,673,245 B2
(45) Date of Patent: Jun. 6, 2017

(54) IMPLANT ISOLATED DEVICES AND METHOD FOR FORMING THE SAME

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Tzu-Hsuan Hsu, Kaohsiung (TW); Wen-De Wang, Minsyong Township (TW); Wen-I Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 685 days.

(21) Appl. No.: 13/632,488

(22) Filed: Oct. 1, 2012

(65) Prior Publication Data

US 2014/0091377 A1  Apr. 3, 2014

(51) Int. Cl.
| | |
|---|---|
| *H01L 21/76* | (2006.01) |
| *H01L 27/146* | (2006.01) |
| *H01L 21/761* | (2006.01) |
| *H01L 21/762* | (2006.01) |
| *H01L 21/265* | (2006.01) |
| *H01L 21/28* | (2006.01) |
| *H01L 29/66* | (2006.01) |

(52) U.S. Cl.
CPC ........ *H01L 27/1463* (2013.01); *H01L 21/761* (2013.01); *H01L 21/76237* (2013.01); *H01L 21/2652* (2013.01); *H01L 21/28017* (2013.01); *H01L 29/66575* (2013.01)

(58) Field of Classification Search
None
See application file for complete search history.

(56) References Cited

U.S. PATENT DOCUMENTS

| | | |
|---|---|---|
| 921,924 A | 5/1909 | Wales |
| 4,001,048 A | 1/1977 | Meiling et al. |
| 5,290,714 A | 3/1994 | Onozawa |
| 6,011,290 A | 1/2000 | Gardner et al. |
| 6,448,163 B1 | 9/2002 | Holbrook et al. |
| 7,800,146 B2 | 9/2010 | McKee et al. |
| 2002/0117698 A1* | 8/2002 | Inumiya et al. ............ 257/288 |

(Continued)

FOREIGN PATENT DOCUMENTS

| | | |
|---|---|---|
| KR | 20040008056 | 1/2004 |
| KR | 100597125 | 7/2006 |

(Continued)

*Primary Examiner* — Jerome Jackson, Jr.
*Assistant Examiner* — Abul Kalam
(74) *Attorney, Agent, or Firm* — Slater Matsil, LLP

(57) ABSTRACT

A device includes a semiconductor substrate and implant isolation region extending from a top surface of the semiconductor substrate into the semiconductor substrate surrounding an active region. A gate dielectric is disposed over an active region of the semiconductor substrate, wherein the gate dielectric extends over the implant isolation region. A gate electrode is disposed over the gate dielectric and an end cap dielectric layer is between the gate dielectric and the gate electrode over the implant isolation region.

20 Claims, 8 Drawing Sheets

A-A'

(56) References Cited

U.S. PATENT DOCUMENTS

| | | |
|---|---|---|
| 2004/0058489 A1* | 3/2004 | Arai .................... H01L 21/2652 |
| | | 438/217 |
| 2004/0104404 A1 | 6/2004 | Bito |
| 2004/0173824 A1 | 9/2004 | Nagasaki et al. |
| 2005/0269644 A1 | 12/2005 | Brask et al. |
| 2006/0081942 A1 | 4/2006 | Saito |
| 2006/0148195 A1 | 7/2006 | Hwang |
| 2007/0252240 A1* | 11/2007 | Andresen et al. ............ 257/607 |
| 2008/0012080 A1* | 1/2008 | Yaegashi ....................... 257/391 |
| 2008/0057612 A1 | 3/2008 | Doan et al. |
| 2009/0191697 A1 | 7/2009 | Lee |
| 2010/0022077 A1 | 1/2010 | Krull et al. |
| 2010/0052019 A1 | 3/2010 | Yamamoto et al. |
| 2012/0326233 A1 | 12/2012 | Wang et al. |
| 2013/0277719 A1* | 10/2013 | Kao et al. ..................... 257/288 |

FOREIGN PATENT DOCUMENTS

| | | |
|---|---|---|
| KR | 20060077707 | 7/2006 |
| KR | 100650777 | 11/2006 |
| KR | 20080038434 | 5/2008 |
| KR | 20090045294 | 5/2009 |
| KR | 20090082627 | 7/2009 |
| TW | 560005 | 11/2003 |
| TW | 200416901 | 9/2004 |

* cited by examiner

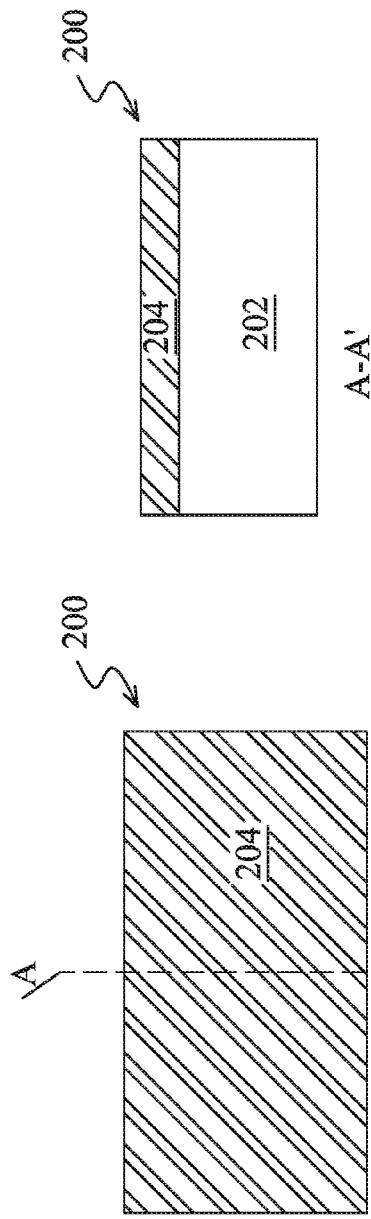
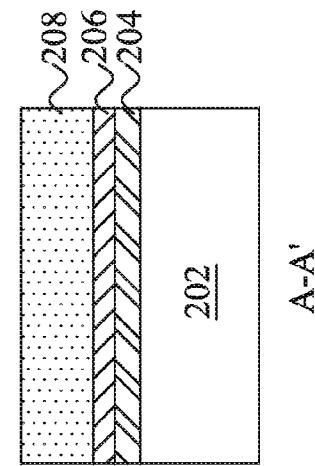
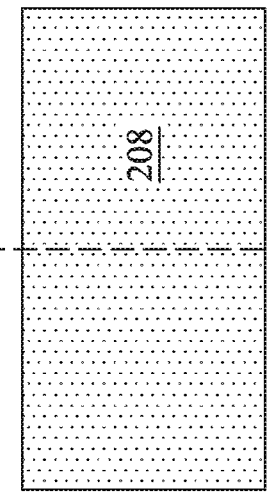

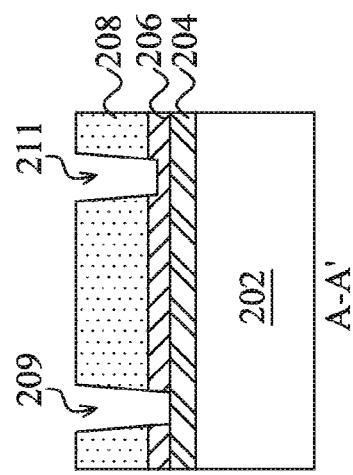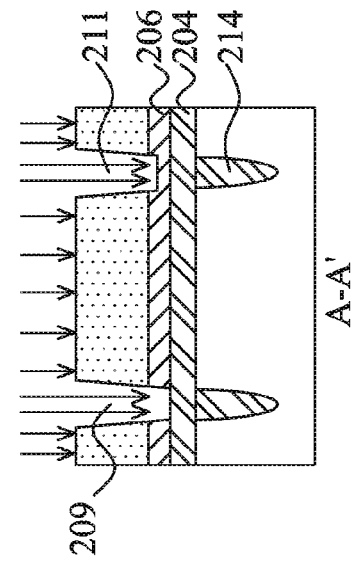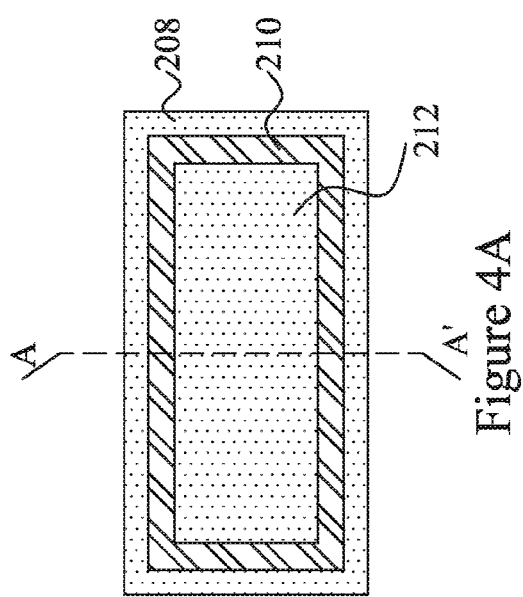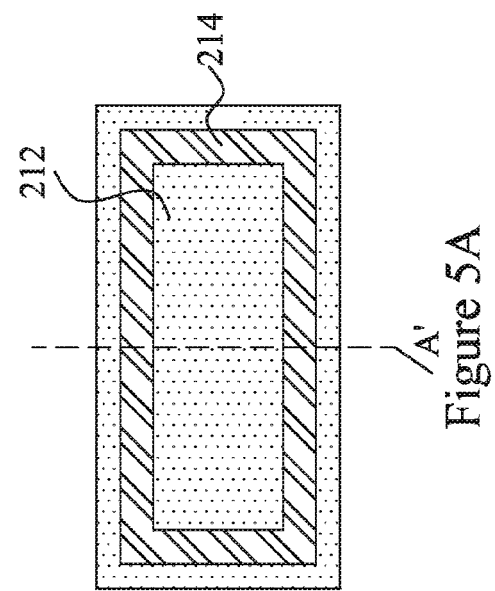

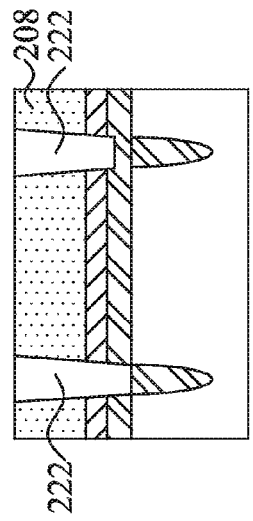
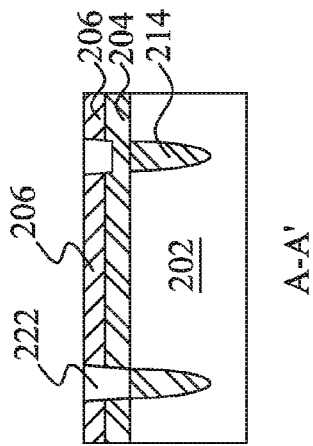
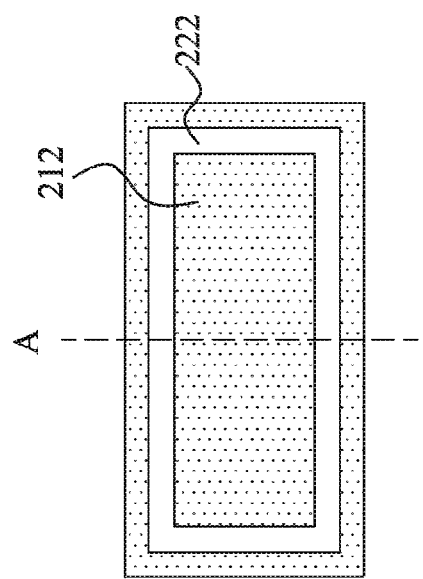
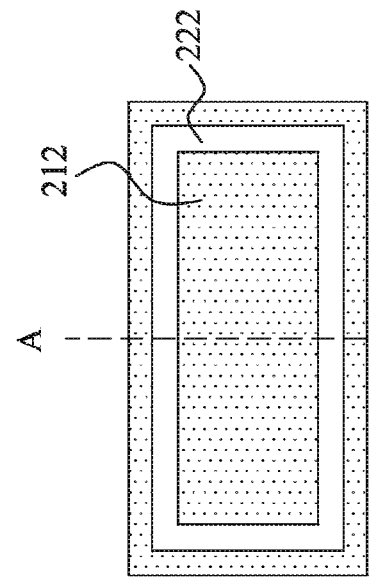
Figure 8B
Figure 9B
Figure 8A
Figure 9A

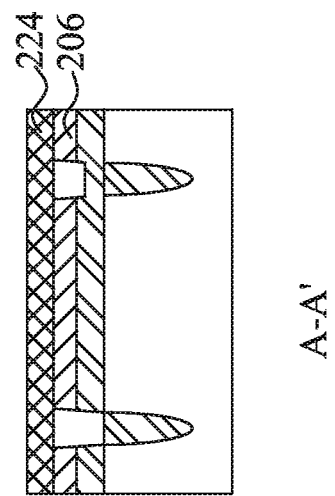
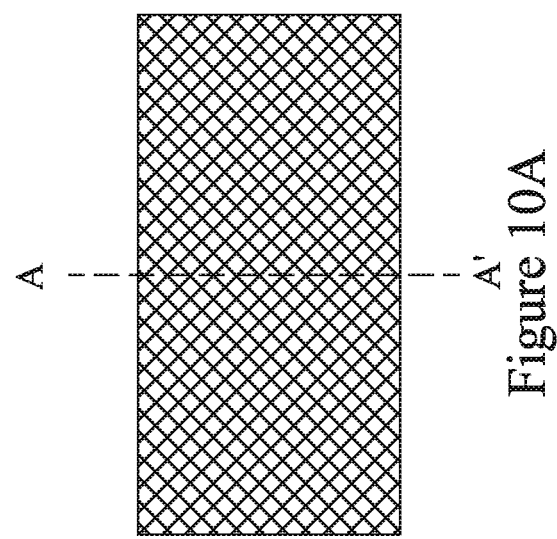
Figure 10B
A-A'
Figure 10A

A-A'

B-B'

B-B'

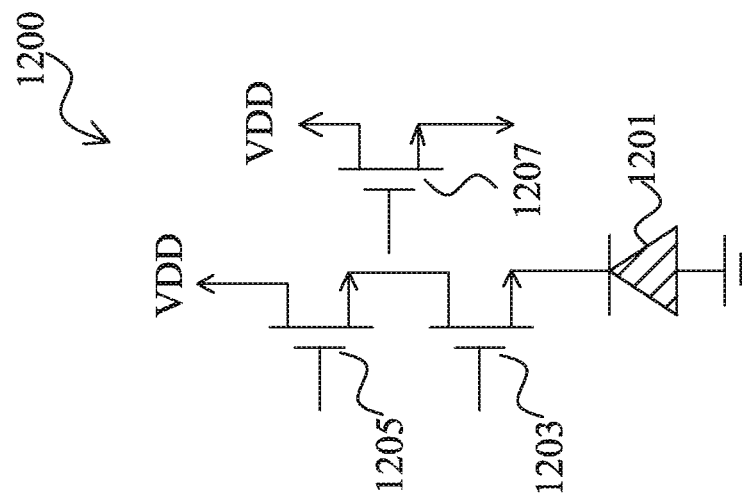
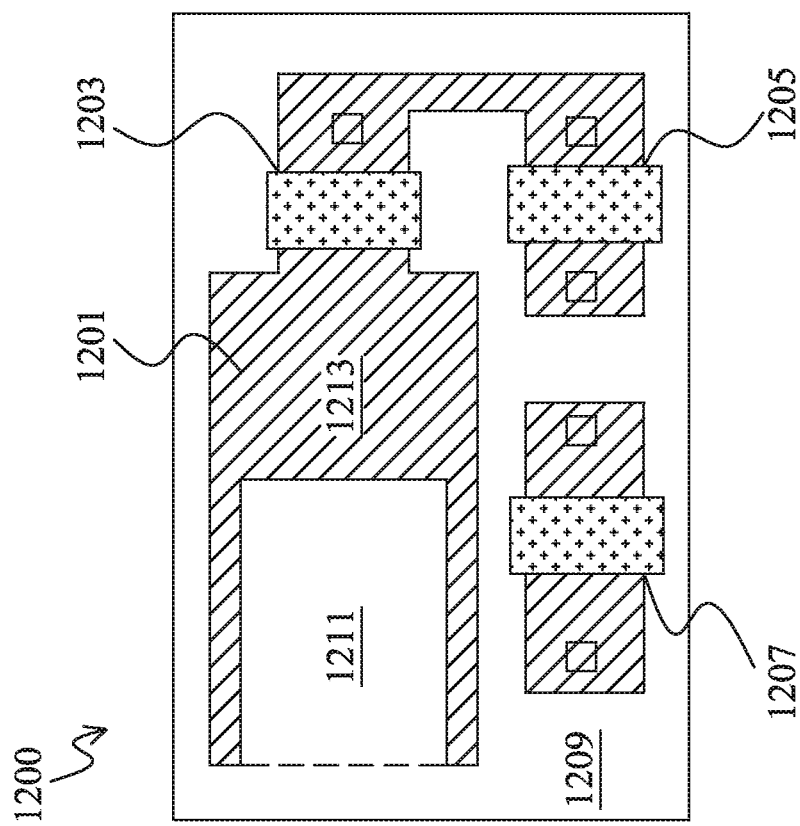
Figure 12A
Figure 12B

IMPLANT ISOLATED DEVICES AND METHOD FOR FORMING THE SAME

FIELD

The present disclosure relates generally to semiconductor devices and manufacturing processes. More particularly, it relates to semiconductor devices having an implant isolation and processes for forming these devices.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Implant isolation regions formed by well implantation are thus replacing the conventional Shallow Trench Isolation (STI) regions to isolate devices. With the formation of the implant isolation regions using implantation rather than STI regions, the damage to silicon surfaces caused by the formation of the STI regions is eliminated.

The implant isolation regions are formed by implanting an impurity to portions of a substrate, which portions surround the active regions of the integrate circuit devices that are to be isolated. It is difficult to control the accuracy in the overlay of the components of the integrated circuit devices with the implant isolation regions. If the gate electrodes are misaligned to the implant isolation regions, gate electrodes may not be able to fully separate the channel between the source and drain regions of the devices, forming a leakage path. Under high voltage application to a gate electrode over the implant isolation region, a parasitic transistor may develop.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 2A and 2B are top views and cross-sectional views of intermediate stages in the manufacturing of a device in accordance with some embodiments;

FIGS. 3A and 3B are top views and cross-sectional views of intermediate stages in the manufacturing of a device in accordance with some embodiments;

FIGS. 4A and 4B are top views and cross-sectional views of intermediate stages in the manufacturing of a device in accordance with some embodiments;

FIGS. 5A and 5B are top views and cross-sectional views of intermediate stages in the manufacturing of a device in accordance with some embodiments;

FIGS. 8A and 8B are top views and cross-sectional views of intermediate stages in the manufacturing of a device in accordance with some embodiments;

FIGS. 9A and 9B are top views and cross-sectional views of intermediate stages in the manufacturing of a device in accordance with some embodiments;

FIGS. 10A and 10B are top views and cross-sectional views of intermediate stages in the manufacturing of a device in accordance with some embodiments;

FIGS. 12A and 12B are top views and circuit diagram of a device in accordance with some embodiments.

DETAILED DESCRIPTION OF ILLUSTRATIVE EMBODIMENTS

Figure 1:
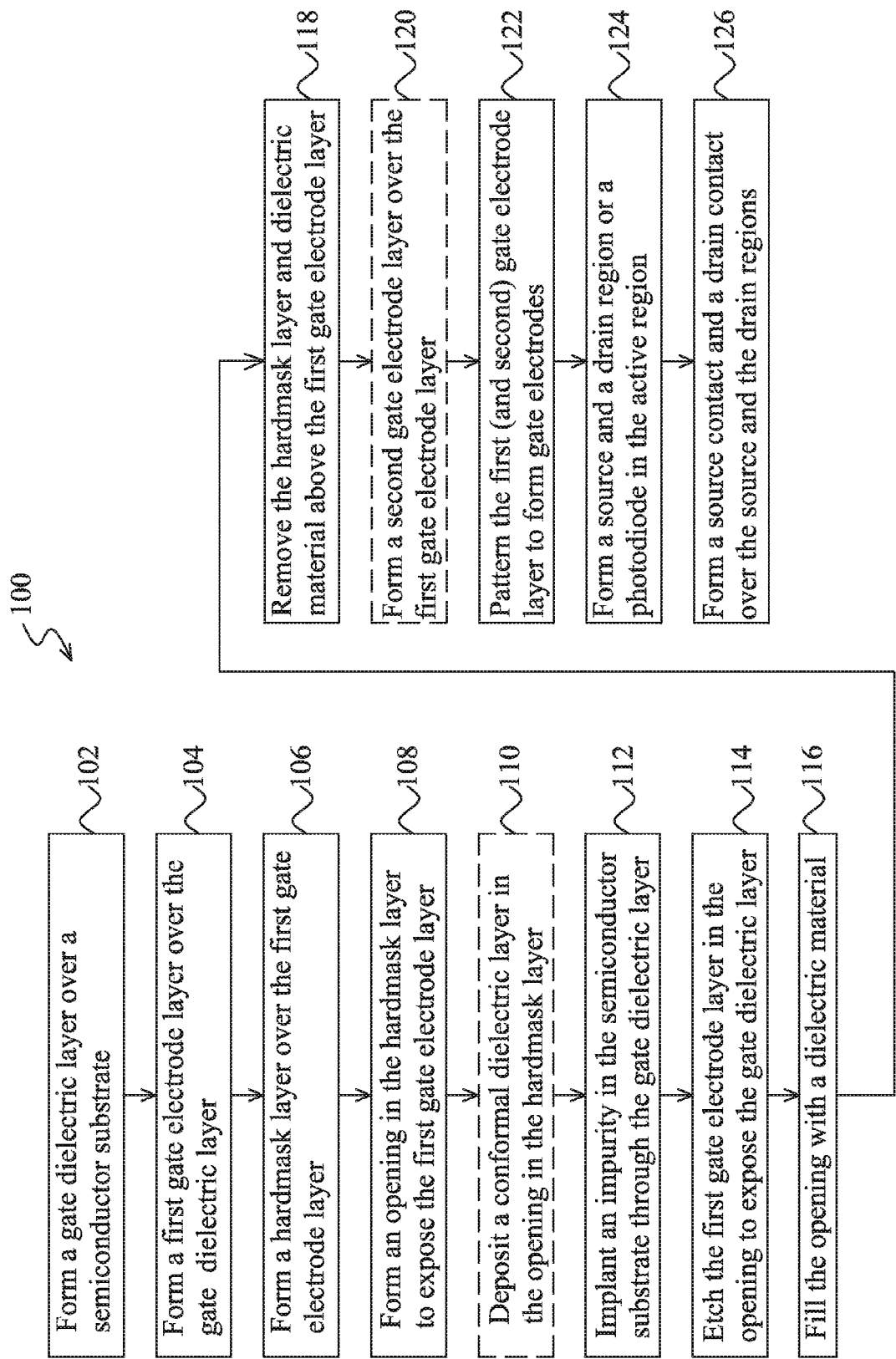
FIG. 1 is a flowchart of various method embodiments for making a semiconductor structure having implant isolation region according to various aspects of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming implant isolation regions and a semiconductor device at an active region adjacent the implant isolation regions are provided in accordance with various exemplary embodiments. The intermediate stages of forming the implant isolation regions and the device are illustrated. The variations of the embodiments are discussed. Throughout the various views and illustrative embodiments, like reference numbers are used to designate like elements.

Implant isolation regions are used to isolate electronic components formed in semiconductors from each other. These electronic components include diodes, such as photodiodes and Schottky diodes, transistors, such as field-effect transistors, bipolar junction transistors, and insulated gate bipolar transistors, and other electronic components such as rectifiers, thyristors, and capacitors. These electronic components, together or by themselves, are semiconductor devices used in various applications. For example, a pixel in an image sensor includes one or more photodiodes and three or more transistors connected to the one or more photodiodes. In another example, a number of transistors, usually six or eight, are used to form one bit of a static random-access memory.

An implant isolation region surrounding a transistor is formed by implanting a semiconductor substrate with a dopant of a conductivity type opposite that of the conductivity type of the active region of the transistor. A gate structure is formed across the active region to control the transistor. During normal operation, the implant isolation region prevents currents from leaking through ends of the gate structure and eliminates noise effects from other electronic components. To ensure no current would bridge a channel region of the transistor, the gate structure is formed with end caps on both ends that overlap the isolation region surrounding the transistor. Without end caps, a small misalignment would expose a portion of the channel region that can be bridged as a leakage path. However, the use of the end caps on the implant isolation region can cause a formation of a parasitic transistor when high voltage is applied to the gate. Specifically, the parasitic transistor would include the end cap as the gate and the implant isolation region under the end cap as a channel region and divert energy from its host transistor. The parasitic transistor would impact performance of the host transistor by reducing effective channel width and creating an interfering electric field. If the parasitic transistor forms, the threshold voltage for the host transistor would increase and power consumption would increase.

Semiconductor devices using an implant isolation region that reduces or eliminates the likelihood of forming a parasitic transistor are disclosed in accordance with various embodiments of the present disclosure. Methods for making the semiconductor device are also disclosed. An end cap dielectric layer is used in between the implant isolation region and portions of the gate electrode over the implant isolation region to reduce the likelihood of forming a channel region of a parasitic transistor. An opening is formed first in a mask stack for implanting dopants into the implant isolation region at the bottom of the opening. The dopants may travel through one or more layers of the mask stack, which includes a gate electrode layer. Then a dielectric material is deposited in the opening and all materials above the gate electrode layer removed. As formed, the hardmask and the implant isolation regions are self-aligned. In some embodiments, a second gate electrode layer is included over a portion of the end cap dielectric layer. In some embodiments, the implantation is performed between two hardmask depositions to reduce the critical dimensions of the implant isolation region.

FIG. 1 is a flowchart of various method embodiments for making a semiconductor structure having implant isolation regions according to various aspects of the present disclosure. FIGS. 2A/2B to FIGS. 11A/11B are top views and cross-sectional views of intermediate stages in the manufacturing of a device in accordance with some operations of various method embodiments shown in the flowchart of FIG. 1. Figures having "A" designation are top views that show a cut line A-A'. The cut line A-A' is the cut-plane of the cross-sectional view of figures having a "B" designation. All subsequent figures having the "A" and "B" designation have the same cut line, which description is not repeated for every figure. Note that the various figures used to illustrate the various embodiments are not drawn to scale. In the present disclosure, a wafer refers to a partially fabricated workpiece that includes a substrate and various layers in or over the substrate.

Referring to FIG. 1, the flowchart 100 includes operation 102 where a gate dielectric layer is formed over a semiconductor substrate. FIGS. 2A and 2B are top views and cross-sectional views of a wafer 200 in accordance with operation 102 of FIG. 1. A substrate 202 is provided. In some embodiments, substrate 202 is a bulk silicon substrate. In some embodiments, substrate 202 is a Silicon-On-Insulator substrate. In alternative embodiments, substrate 202 is formed of other semiconductor materials such as silicon carbide, silicon germanium, III-V compound semiconductor materials, or the like. A gate dielectric layer 204 is deposited over substrate 202. Gate dielectric layer 204 may include an oxide, a nitride, an oxynitride, a carbide, or combinations thereof. The gate dielectric layer 204 may be a thermally grown silicon oxide and may be between about 20 angstroms to 200 angstroms thick. In some embodiments, the gate dielectric layer 204 is about 70 angstroms. In some embodiments, the gate dielectric 204 is a high-k dielectric such as hafnium silicate, zirconium silicate, hafnium dioxide and zirconium dioxide.

Referring to FIG. 1, in operation 104 a first gate electrode layer is formed over the gate dielectric layer. FIGS. 3A and 3B include the gate electrode layer 206 over the gate dielectric layer 204. Gate electrode layer 206 may be formed of polysilicon over a gate dielectric layer of silicon oxide. Alternatively, gate electrode layer 206 may be formed of metals such as tantalum, tungsten, tantalum nitride, and titanium nitride over a high-k dielectric layer.

Referring to FIG. 1, in operation 106 a hardmask layer is formed over the first gate electrode layer. FIGS. 3A and 3B include the hardmask layer 208 over the gate electrode layer 206. In some embodiments, one or more layers are included between the hardmask layer 208 and the gate electrode layer 206. For example, one or more of these layers includes a bottom anti-reflective coating (BARC) layer. The hardmask layer 208 is sufficiently thick to shield the gate electrode layer 206 below from subsequent ion implantation operations. For high energy ion implantations, for example, greater than about 50 keV, the hardmask layer may be greater than 1000 angstroms. In some embodiments, hardmask 208 comprises silicon nitride. In alternative embodiments, hardmask 208 is formed of other dielectric materials such as oxynitride (SiON), silicon carbide or silicon oxide.

Referring to FIG. 1, in operation 108 an opening is formed in the hardmask layer to expose the first gate electrode layer or the gate dielectric layer. As shown in FIGS. 4A and 4B, hardmask 208 is patterned to form openings 209 and 211. Two types of openings are shown in FIG. 4B. In some embodiments, the opening is shown as 209 that exposes the gate dielectric layer 204. In other embodiments, the opening is shown as 211 that exposes the first gate electrode layer 206. A part of the gate electrode layer 206 may be removed. Openings 209 and 211, although looking like separate openings in FIG. 4B, may be parts of a continuous opening around an active region 212, as shown in FIG. 4A. In other words, in an actual device, the entire opening (both openings as shown in cross section) would extend down to the dielectric layer 204 (in other words, both would look like hole 209) or the entire opening would extend only to the first gate electrode layer 206 (in other words would look like hole 211). Both types of hole are shown in FIG. 4B simply for purposes of illustration. In some embodiments, as shown in FIG. 4A, opening 209 or 211 is rectangular. In alternative embodiments, openings 209 and 211 have other layouts and shapes, depending on the shape of the devices that is to be isolated. A photoresist is first deposited and patterned over the hardmask layer 208. After developing and removing a portion of the photoresist layer, an etch step is further preformed into the hardmask layer 208 that may remove partially or all of the gate electrode layer 206. For example, the etching of opening 209/211 may be performed using a fluorine based chemistry or a chlorine based chemistry, for example, carbon tetrafluoride or chlorine as the etchant. In some embodiments shown as FIGS. 4A and 4B, the opening exposes the gate dielectric layer 204.

Referring back to FIG. 1, an impurity is implanted in the semiconductor substrate through the gate dielectric layer in operation 112. As shown in FIG. 5B, the impurity implanted into the semiconductor substrate forms an implant isolation region 214. As a result, active region 212 (shown in FIG. 5A), which may be used for forming a field-effect transistor (FET) device, is encircled by implant isolation regions 214. The implantation (symbolized by arrows) is performed using an energy level high enough for the implanted impurity to penetrate through the portion of gate electrode layer 206 (if not completely removed in operation 108 of FIG. 1) and gate dielectric layer 204, yet not high enough to penetrate through hardmask 208 over portions of gate electrode layer 206. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like. The conductivity type of implant isolation regions 214 is opposite of the conductivity type of active region of the device.

Figure 6B:
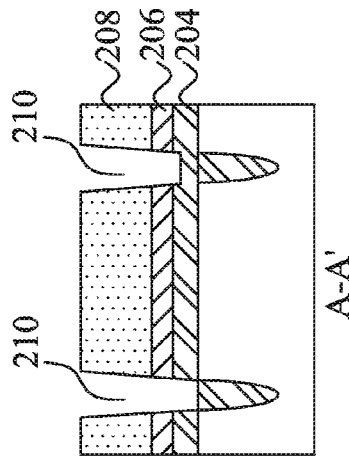
FIGS. 6A and 6B are top views and cross-sectional views of intermediate stages in the manufacturing of a device in accordance with some embodiments.
Figure 6A:
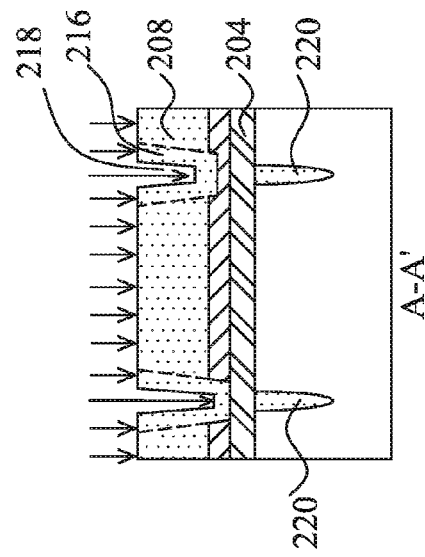

In some embodiments, an optional operation of depositing a conformal dielectric layer in the opening in the hardmask layer is performed before implanting the impurity (operation 110 of FIG. 1). As shown in FIGS. 6A and 6B, the conformal dielectric layer 216 reduces size of the opening in the hardmask layer so that a smaller opening 218 results. The subsequent ion implantation through the smaller opening 218 forms a correspondingly smaller dimensioned implant isolation region 220. Because the conformal dielectric deposits also at the bottom of the opening 218, the subsequent ion implantation parameter is tuned so that a desired amount of dopant would implant through the conformal dielectric layer 216 and the gate dielectric layer 204 (or in some embodiments gate electrode layer 206) to the substrate 202 below. In some embodiments, the conformal dielectric 216 and hardmask layer 208 are same material. In other embodiments, the conformal dielectric 216 and hardmask layer 208 are different materials. Reducing the dimension of the implant isolation region 220 of FIG. 6A relative to the implant isolation region 214 of FIG. 5A allows a larger active region to be used with the same silicon area, which increases the well capacity of the active region.

Figure 7B:
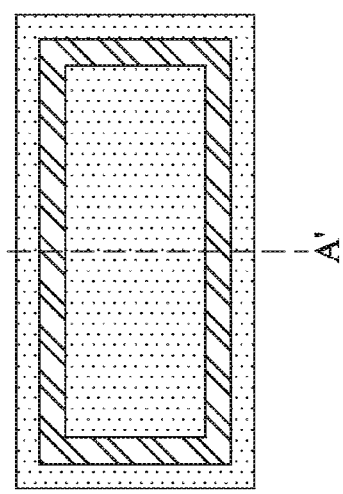
FIGS. 7A and 7B are top views and cross-sectional views of intermediate stages in the manufacturing of a device in accordance with some embodiments.
Figure 7A:
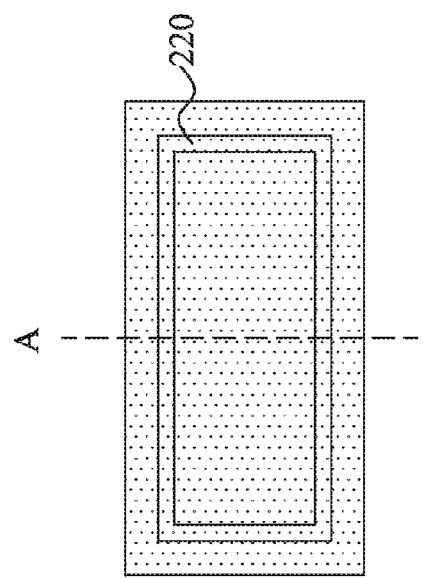

Referring back to FIG. 1, in operation 114 the first gate electrode layer in the opening is etched to expose the gate dielectric layer. This operation is performed when the opening in the hardmask from operation 108 does not completely remove the first gate electrode layer in the opening. To ensure complete removal of the first gate electrode layer, a portion or all of the gate dielectric layer may be removed also. As shown in FIGS. 7A and 7B, openings 210 are formed in the hardmask layer 208 through the first gate electrode layer 206 down to the gate dielectric layer 204, as shown in the right opening 210 of FIG. 7B. In FIG. 7A, the dielectric layer 204 is exposed in trench 210 in a ring. However, in some embodiments, the dielectric layer 204 is completely removed as shown in the left opening 210 of FIG. 7B. In other words, in an actual device, the entire opening (both openings as shown in cross section) would extend down to the dielectric layer 204 (in other words, both would look like left opening 210) or the entire opening would extend only to the first gate electrode layer 206 (in other words would look like right opening 210). Both types of hole are shown in FIG. 7B simply for purposes of illustration.

Referring back to FIG. 1, in operation 116 the opening is filled with a dielectric material. As shown in FIGS. 8A and 8B, the openings 210 of FIG. 7B are filled with a dielectric material to form a dielectric ring 222 above and around the active area 212. In some embodiments, the dielectric material is a same material as the hardmask layer 208. In other embodiments, the dielectric material is different. The dielectric material may be a silicon oxide, silicon nitride, silicon oxynitride, carbon doped silicon oxide, or a metal oxide or metal nitride that would provide isolation. Although FIG. 8A does not show any dielectric material above the hardmask layer 208, in processing after the filling the openings 210, it is expected that the dielectric material would also be deposited in the field around the openings.

Referring back to FIG. 1, in operation 118 the hardmask layer and the dielectric material above the first gate electrode layer are removed. A variety of processes may be used together in different combinations to achieve the cross-section of FIG. 9B, depending on the material used in the various layers to be removed. In some embodiments, a chemical mechanical polishing (CMP) operation may be used to planarize the wafer down to the first gate electrode layer. The CMP process may include chemical etchants that breaks down the hardmask layer 208 as well as mechanically polish the surface. A wet etch process may also be used, especially if a BARC layer was used between the first gate electrode layer and the hardmask layer, for example, with phosphor acid based etchant. Additional oxides may be removed by another wet etch using hydrofluoric acid based etchant. FIGS. 9A and 9B are top view and cross-section views of the wafer after operation 118. In the top view, an active area 212 of the first gate electrode layer 206 is surrounded by a dielectric ring 222. An implant isolation ring 214 is embedded in the semiconductor substrate 202, corresponding to the dielectric ring 222. A gate dielectric layer 204 is disposed between the first gate electrode layer 206/dielectric ring 222 and the substrate 202/embedded implant isolation 214. The gate dielectric layer 204 may have different thicknesses at different areas.

Referring back to FIG. 1, in optional operation 120 a second gate electrode layer is deposited over the first gate electrode layer. As shown in FIGS. 10A and 10B, the second gate electrode layer 224 covers the wafer. The second gate electrode layer 224 is generally the same material as the first gate electrode layer 206. For example, if the first gate electrode layer 206 is a type of polysilicon, then the second gate electrode layer 224 is a same type of polysilicon. In some embodiments, the second gate electrode layer 224 is a different material, for example, a polysilicon with different doping amounts.

Figure 11B:
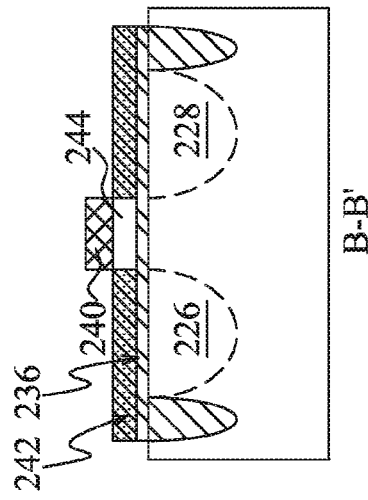
FIGS. 11A, 11B, 11C, and 11D are top views and cross-sectional views of intermediate stages in the manufacturing of a device in accordance with some embodiments.

Referring back to FIG. 1, in operation 122 the one or more gate electrode layers are patterned to form a gate electrode. The operation includes depositing a photoresist over the wafer, exposing the wafer to a light pattern, and developing the photoresist to remove unwanted portions. The wafer is then etched to remove material not protected by the photoresist material in one or more etch process. As shown in FIGS. 11A, 11B and 11C, the patterned gate electrode includes a remaining portion 238 of the first gate electrode layer 206 and a remaining portion 240 of the second gate electrode layer 224 that divides the active region into a source region 226, a drain region 228, and a channel region under the gate electrode 230. The second gate electrode portion 240 extends over all or a portion of dielectric material over the implant isolation region 234 (234 being the portion of implant region 214 that extends under the end caps 232. The extended portion becomes the end caps 232 of the gate electrode. The portion of dielectric material adjoining the first gate electrode layer 238 is the end cap dielectric layer 244. While FIG. 11B shows the end cap dielectric layer 244 having a portion under the gate end cap 232 and a portion not under the gate end cap 232, in some embodiments, the portion not under the gate end cap 232 may be removed.

The dielectric material 242 surrounding the source region 226 and the drain region 228 may also be removed in this operation or in a subsequent process, as shown in FIG. 11C. The gate dielectric layer in the source region 226 and drain region 228 and surrounding the implant isolation region 234 may be removed in this operation or in a subsequent process. To ensure complete removal of the gate dielectric layer material from areas not covered by the photoresist, a wet etch may be used after the polysilicon dry etch.

Figure 11D:
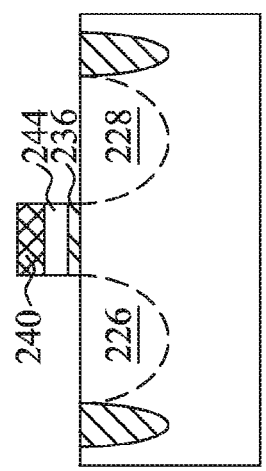
Figure 11A:
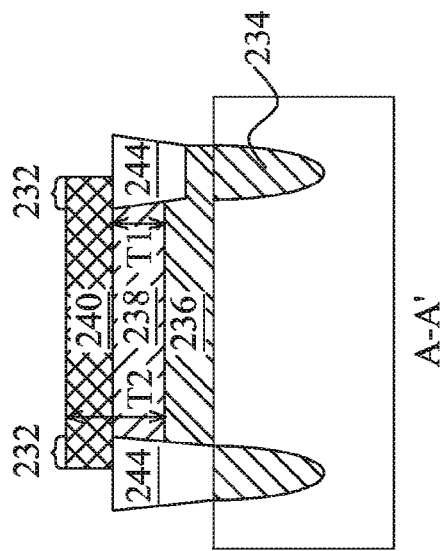
Figure 11C:
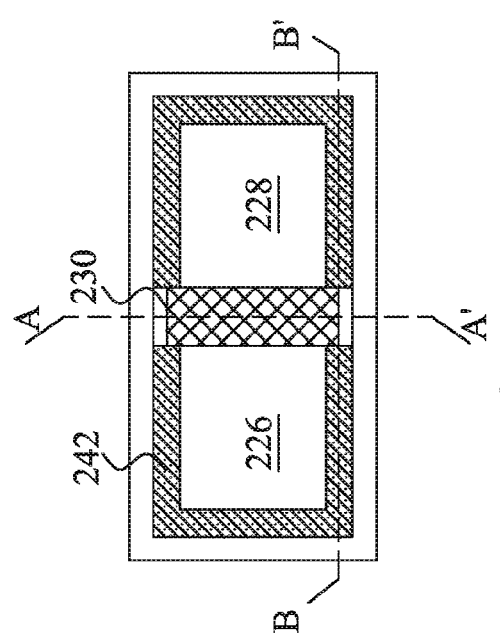

Alternatively, as shown in FIG. 11D, the dielectric material 242 surrounding the source region 226 and the drain region 228 and underlying gate dielectric layer 236 are not removed in this operation. In some cases, these layers do not affect the electrical properties of the device and may remain in a final product.

In one example, the gate electrode 230 has a total thickness T2, at about 1000 angstroms. The first gate electrode layer of the gate electrode has a thickness T1, at about 500 angstroms. The gate dielectric under the first gate electrode layer has a thickness at about 70 angstroms. Because the gate dielectric is thin relative to the first gate electrode layer, and its thickness under the end cap dielectric layer 244 may be reduced, the end cap dielectric layer 244 has a thickness close to the first gate electrode layer, at about 500 angstroms.

Referring back to FIG. 1, some additional operations are discussed to complete the formation description of a transistor to provide context for the present disclosure. In operation 124, a source and a drain region is formed in the active region by implanting a dopant into the semiconductor substrate. If the semiconductor device includes a photodiode, it may be formed in the active region by implanting a dopant of a conductivity type different from the implant isolation region. FIG. 11C shows a cross section view of the partially fabricated transistor of FIG. 11A from the cut line B-B', through an end cap of the gate electrode 230. As shown in FIG. 11C at the end cap, the gate stack includes a gate dielectric 236, an end cap dielectric 244, and second gate electrode layer 240. Source 226 and drain 228 are shown in phantom feature in FIG. 11C because these features are actually behind the cut plane of B-B' illustrated in this drawing. These features are included to place the other illustrated features in context. Other portions of the dielectric material deposited in operation 116 may not be removed or may be removed partially during gate electrode patterning. The wafer is annealed to activate various dopants. During the anneal, implantation regions diffuse and change shape when dopants migrate, thus a width of the implant isolation region, measured along a length of the gate electrode, may increase from the width as deposited. In other words, even though the implant isolation region is self-aligned with the first gate electrode layer 238 as formed, after annealing the implant isolation region and the first gate electrode layer 238 may not be aligned.

Referring back to FIG. 1, in operation 126, a source contact and a drain contact over a portion of the source and drain regions are formed. Details of a source and drain region formation and contact formation are known in the art and are not described herein.

As discussed, the various embodiments of the present disclosure can be used to form different semiconductor devices. One such device is an image sensor. FIGS. 12A and 12B are a layout of an exemplary image sensor 1200 with three transistors and its circuit diagram. The image sensor 1200 includes a Photo Diode 1201, Transfer transistor 1203, reset transistor 1205, and source follower transistor 1207. Implant isolation region 1209 is formed all around the semiconductor device and between transfer transistor 1203 and reset transistor 1205, between reset transistor 1205 and source follower transistor 1207, and between source follower transistor 1207 and the photodiode 1201. For typical image sensors, the implant isolation region is p-type. The photodiode 1201 includes a deep n-well 1213 and a shallow p-well 1211 over a portion of the deep n-well 1213. As shown in the circuit diagram, the source of the transfer transistor 1203 is connected to the photodiode 1201, and the drain of the transfer transistor 1203 is connected to the source of the reset transistor 1205 and to the gate of the source follower transistor 1207. The drain of both of the reset transistor 1205 and the source follower transistor 1207 are connected to a voltage supply $V_{DD}$. In FIG. 12A, the connection between the drain of the transfer transistor 1203 and the source of the reset transistor 1205 is formed by extending the drain of the transfer transistor 1203 and the source of the reset transistor 1205 to overlap. The connection between the gate of the source follower transistor 1207 and the drain of the transfer transistor 1203/the source of the reset transistor 1205 is formed by utilizing a metal layer above the layout.

In the various embodiments, implantation implant isolation regions are formed, whose formation incurs less damage to the surface of substrate compared to the conventional Shallow Trench Isolation (STI) region because the STI formation requires strong etching into the semiconductor substrate. By using an end cap dielectric between the end cap portions of the gate electrode and the implant isolation region, parasitic behavior that can reduce performance under some conditions is avoided. Further, by reducing the hardmask opening before implanting the isolation region, the implant isolation regions may occupy a reduced chip area. The full well capacity of the image sensor is thus increased.

In accordance with some embodiments, a device includes a semiconductor substrate having an active region, and an implant isolation surrounding the active region and extending from a top surface of the semiconductor substrate into the semiconductor substrate. A gate dielectric is disposed over an active region of the semiconductor substrate, wherein the gate dielectric extends at least partially over the implant isolation region. A gate electrode is disposed over the gate dielectric, and an end cap dielectric layer is on the gate dielectric layer over the implant isolation region between the gate electrode and the implant isolation region.

In accordance with yet other embodiments, a method includes forming a gate dielectric layer over a semiconductor substrate, forming a first gate electrode layer over the gate dielectric layer, forming a hardmask layer over the first gate electrode layer, and forming an opening in the hardmask layer to expose the first gate electrode layer. An impurity is then implanted, wherein the impurity penetrates through a portion of the gate electrode layer to form an implant isolation region in the semiconductor substrate. The gate electrode layer is etched to expose the gate dielectric layer and a dielectric material fills the opening. The hardmask layer and dielectric material above the first gate electrode layer and then removed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   forming a gate dielectric layer over a semiconductor substrate;
   forming a first gate electrode layer over the gate dielectric layer;
   forming a hardmask layer over the first gate electrode layer;
   forming an opening in the hardmask layer to expose the first gate electrode layer;
   implanting an impurity, wherein the impurity penetrates through the gate dielectric layer to form an implant isolation region in the semiconductor substrate surrounding an active region of the semiconductor substrate;
   etching the first gate electrode layer in the opening to expose the gate dielectric layer;
   filling the opening with a dielectric material; and,
   removing the hardmask layer and dielectric material above the first gate electrode layer.

2. The method of claim 1, further comprising forming a second gate electrode layer over the first gate electrode layer and patterning a gate electrode.

3. The method of claim 1, wherein the forming an opening in the hardmask layer comprises removing a portion of the first gate electrode layer at a bottom of the opening in the hardmask layer.

4. The method of claim 1, wherein the removing the hardmask layer and dielectric material comprises planarizing and wet etching.

5. The method of claim 1, further comprising depositing a conformal dielectric layer in the opening before implanting an impurity.

6. The method of claim 1, wherein the hardmask layer and the dielectric material are a same material.

7. The method of claim 1, wherein the first gate electrode layer is polysilicon.

8. The method of claim 1, further comprising:
   forming a source and a drain region in the active region; and
   forming a source contact and a drain contact overlapping the source and the drain regions, respectively.

9. The method of claim 1, further comprising:
   forming a photodiode in the active region.

10. The method of claim 1, wherein the active region comprises a plurality of active regions, and the implant isolation region comprises a plurality of implant isolation regions, wherein each of the plurality of active regions is surrounded by one of the plurality implant isolation regions and the plurality of active regions are connected to form an image sensor.

11. The method of claim 1, wherein the implanting an impurity comprises implanting at an implantation energy greater than about 50 keV.

12. A method comprising:
   forming over a semiconductor substrate a gate stack comprising a gate dielectric and a first gate electrode layer;
   forming a patterned hardmask over the gate stack;
   removing an upper portion of the gate stack to form an opening therein, while leaving remaining a lower portion of the gate stack;
   implanting an impurity through the remaining lower portion of the gate stack;
   filling the opening with a dielectric material on the remaining lower portion of the gate stack; and
   removing any remaining hardmask layer and dielectric material above the gate stack, while leaving the dielectric material in the opening; and
   forming over the first gate electrode layer and over the dielectric material in the opening, a second gate electrode layer.

13. The method of claim 12, wherein the first gate electrode layer overlies the gate dielectric and the step of removing an upper portion of the gate stack to form an opening therein, while leaving remaining a lower portion of the gate stack includes etching through the first gate electrode layer, while leaving the gate dielectric remaining.

14. The method of claim 12, wherein the first gate electrode layer overlies the gate dielectric and the step of removing an upper portion of the gate stack to form an opening therein, while leaving remaining a lower portion of the gate stack includes etching through the first gate electrode and partially through the gate dielectric, while leaving a portion of the gate dielectric remaining.

15. The method of claim 12, wherein the first gate electrode layer overlies the gate dielectric and the step of removing an upper portion of the gate stack to form an opening therein, while leaving remaining a lower portion of the gate stack includes etching partially through the first gate electrode while leaving a portion of the first gate electrode layer remaining and while leaving the gate dielectric remaining.

16. The method of claim 15, further comprising removing the portion of the first gate electrode layer remaining after the step of implanting an impurity through the remaining lower portion of the gate stack.

17. The method of claim 15 wherein the step of implanting an impurity through the remaining lower portion of the gate stack forms an implant isolation region in the semiconductor substrate surrounding an active region of the semiconductor substrate.

18. A method comprising:
   forming a gate stack over a substrate, the gate stack including a first gate electrode layer;
   forming a trench that extends from a topmost surface of the gate stack into the gate stack;
   implanting an impurity into the substrate using the gate stack and the trench as a mask, the impurity being implanted into the substrate beneath a bottom of the trench and not beneath the topmost surface of the gate stack;
   completely filling the trench with a dielectric material; and
   forming a second gate electrode layer over the dielectric material and the first gate electrode layer.

19. The method of claim 18, wherein the step of forming a trench that extends from a topmost surface of the gate stack into the gate stack includes forming the trench through the first gate electrode layer.

20. The method of claim 18, wherein the step of forming a trench that extends from a topmost surface of the gate stack into the gate stack includes forming the trench through the first gate electrode layer and at least partially through a gate dielectric underlying the first gate electrode layer.

* * * * *